US012573875B2

(12) United States Patent
Momochi et al.

(10) Patent No.: US 12,573,875 B2
(45) Date of Patent: Mar. 10, 2026

(54) POWER SUPPLY APPARATUS WITH BYPASS CIRCUIT TEST MODE

(71) Applicant: TMEIC Corporation, Tokyo (JP)

(72) Inventors: Nobuyuki Momochi, Chuo-ku (JP); Haruyoshi Mori, Chuo-ku (JP)

(73) Assignee: TMEIC Corporation, Tokyo (JP)

( * ) Notice: Subject to any disclaimer, the term of this patent is extended or adjusted under 35 U.S.C. 154(b) by 0 days.

(21) Appl. No.: 18/727,782

(22) PCT Filed: Nov. 24, 2022

(86) PCT No.: PCT/JP2022/043347
§ 371 (c)(1),
(2) Date: Jul. 10, 2024

(87) PCT Pub. No.: WO2024/111083
PCT Pub. Date: May 30, 2024

(65) Prior Publication Data
US 2025/0096596 A1     Mar. 20, 2025

(51) Int. Cl.
*H02J 9/06*          (2006.01)
*G01R 31/42*        (2006.01)

(52) U.S. Cl.
CPC .............. *H02J 9/062* (2013.01); *G01R 31/42* (2013.01)

(58) Field of Classification Search
CPC .......................... H02J 9/04–08; H02J 3/38–50
See application file for complete search history.

(56) References Cited

U.S. PATENT DOCUMENTS

| | | | | |
|---|---|---|---|---|
| 5,786,641 A | * | 7/1998 | Nakanishi .............. | G01R 31/40 307/64 |
| 2005/0286274 A1 | * | 12/2005 | Pfitzer ................... | G01R 31/40 363/37 |
| 2005/0288826 A1 | * | 12/2005 | Tassitino ................. | H02J 9/062 700/295 |
| 2012/0217809 A1 | * | 8/2012 | Sato ........................ | H02J 9/062 307/64 |
| 2013/0193760 A1 | * | 8/2013 | Colombi ................. | H02J 9/062 307/64 |
| 2013/0193761 A1 | * | 8/2013 | Colombi ................. | H02J 9/062 307/64 |

(Continued)

FOREIGN PATENT DOCUMENTS

JP         2022-143967 A      10/2022

OTHER PUBLICATIONS

International Search Report issued Feb. 7, 2023 in PCT/JP2022/043347, filed on Nov. 24, 2022, 2 pages.

Primary Examiner — Rexford N Barnie
Assistant Examiner — David A Shiao
(74) *Attorney, Agent, or Firm* — Oblon, McClelland, Maier & Neustadt, L.L.P.

(57) ABSTRACT
A controller of this uninterruptible power supply apparatus performs, while an inverter power feeding mode is being performed, a test mode in which a bypass circuit is brought into conduction and an output current from an inverter is decreased, and it is determined whether or not the bypass circuit operates normally based on an output voltage from the inverter. Therefore, when the bypass circuit does not operate normally, the bypass circuit can be repaired or replaced, to prevent operation of a load from being stopped when a fault occurs in the inverter.

5 Claims, 7 Drawing Sheets

(56) References Cited

U.S. PATENT DOCUMENTS

| | | | | |
|---|---|---|---|---|
| 2014/0021789 A1* | 1/2014 | Greer | .......................... | H02J 9/06 |
| | | | | 307/64 |
| 2017/0163088 A1* | 6/2017 | Toyoda | ...................... | H02J 9/02 |
| 2021/0036698 A1* | 2/2021 | Nakano | .............. | H03K 17/0824 |
| 2021/0257851 A1* | 8/2021 | Shigeta | ............... | F16K 31/0675 |
| 2021/0288518 A1* | 9/2021 | Budde | .................. | H02M 3/158 |
| 2023/0006466 A1* | 1/2023 | Zhang | ..................... | H02J 9/062 |
| 2024/0204562 A1* | 6/2024 | Kang | ........................ | H02J 9/06 |

* cited by examiner

POWER SUPPLY APPARATUS WITH BYPASS CIRCUIT TEST MODE

TECHNICAL FIELD

The present disclosure relates to a power supply apparatus, and particularly to a power supply apparatus including an inverter and a bypass circuit.

BACKGROUND ART

Japanese Patent Laying-Open No. 2022-143967 (PTL 1), for example, discloses a power supply apparatus including: an inverter that converts DC power supplied from a DC power supply into AC power; a bypass circuit connected between an AC power supply and a load; and a controller that controls the inverter and the bypass circuit.

When the inverter operates normally, the controller performs a first power feeding mode of bringing the bypass circuit out of conduction, and supplying AC power from the inverter to the load. When the inverter does not operate normally, the controller performs a second power feeding mode of bringing the bypass circuit into conduction, and stopping operation of the inverter. Therefore, even when a fault occurs in the inverter, operation of the load can be continued.

CITATION LIST

Patent Literature

PTL 1: Japanese Patent Laying-Open No. 2022-143967

SUMMARY OF INVENTION

Technical Problem

In such a power supply apparatus, a fault may occur in the bypass circuit while the first power feeding mode is being performed. In this case, the bypass circuit cannot be brought into conduction when a fault occurs in the inverter, resulting in operation of the load being stopped.

Therefore, a main object of the present disclosure is to provide a power supply apparatus capable of preventing operation of a load from being stopped.

Solution to Problem

A power supply apparatus of the present disclosure includes: an inverter that converts DC power supplied from a DC power supply into AC power; a bypass circuit connected between an AC power supply and a load; and a controller that controls the inverter and the bypass circuit. When the inverter operates normally, the controller performs a first power feeding mode of bringing the bypass circuit out of conduction, and supplying AC power from the inverter to the load. When the inverter does not operate normally, the controller performs a second power feeding mode of bringing the bypass circuit into conduction, and stopping operation of the inverter. While the first power feeding mode is being performed, the controller performs a third power feeding mode of bringing the bypass circuit into conduction, and determining whether or not the bypass circuit operates normally based on output voltage from the inverter.

Advantageous Effects of Invention

In the power supply apparatus of the present disclosure, while the first power feeding mode is being performed, the third power feeding mode is performed in which the bypass circuit is brought into conduction, and it is determined whether or not the bypass circuit operates normally based on output voltage from the inverter. Therefore, when it is determined that the bypass circuit does not operate normally, the bypass circuit can be repaired or replaced with a new one, to prevent operation of the load from being stopped when a fault occurs in the inverter.

DESCRIPTION OF EMBODIMENTS

Figure 1:
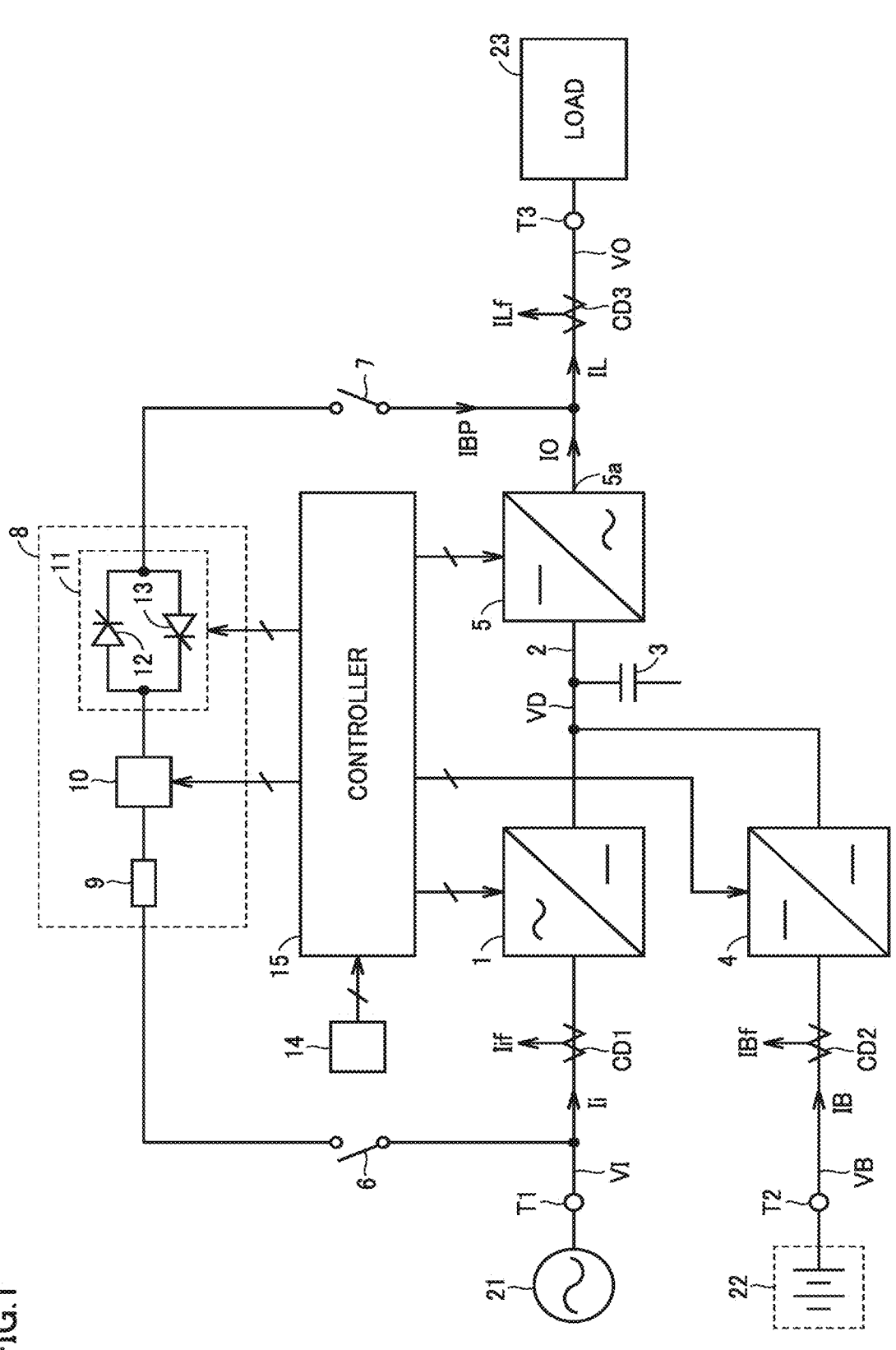
FIG. 1 is a circuit block diagram showing a configuration of an uninterruptible power supply apparatus according to an embodiment of the present disclosure.

FIG. 1 is a circuit block diagram showing a configuration of an uninterruptible power supply apparatus according to an embodiment of the present disclosure. In FIG. 1, this uninterruptible power supply apparatus includes an input terminal T1, a battery terminal T2, an output terminal T3, current detectors CD1 to CD3, a converter 1, a DC line 2, a capacitor 3, a bidirectional chopper 4, an inverter 5, switches 6 and 7, a bypass circuit 8, an operation unit 14, and a controller 15.

Input terminal T1 receives AC power of a commercial frequency from a commercial AC power supply 21. Battery terminal T2 is connected to a battery 22. Battery 22 (power storage device) stores DC power. A capacitor may be connected instead of battery 22. Output terminal T3 is connected to a load 23. Load 23 is driven by AC power of a commercial frequency supplied from the uninterruptible power supply apparatus.

Converter 1, DC line 2, and inverter 5 are connected in series between input terminal T1 and output terminal T3. Capacitor 3 is connected to DC line 2, and smooths and stabilizes a DC voltage VD on DC line 2. Bidirectional chopper 4 is connected between battery terminal T2 and DC line 2.

An instantaneous value of an AC input voltage VI supplied from commercial AC power supply 21 is detected by controller 15. Based on the instantaneous value of AC input voltage VI, controller 15 determines whether or not AC voltage VI is supplied normally from commercial AC power supply 21.

An instantaneous value of an AC output voltage VO applied to load 23 is detected by controller 15. An instantaneous value of DC voltage VD on DC line 2 is detected by controller 15. An instantaneous value of a terminal-to-terminal voltage VB of battery 22 is detected by controller 15.

Current detector CD1 detects an AC input current Ii flowing between commercial AC power supply 21 and converter 1, and provides a signal Iif indicative of the detected value to controller 15. Current detector CD2 detects a DC current IB flowing between battery 22 and bidirectional chopper 4, and provides a signal IBf indicative of the detected value to controller 15. Current detector CD3 detects a load current IL flowing from the uninterruptible power supply apparatus to load 23, and provides a signal ILf indicative of the detected value to controller 15.

Converter 1 (rectifier) is controlled by controller 15, and when AC power is supplied normally from commercial AC power supply 21 (when commercial AC power supply 21 is normal), converter 1 converts AC power from commercial AC power supply 21 into DC power and outputs the DC power to DC line 2. Converter 1 is a well-known converter including a plurality of sets of insulated gate bipolar transistors (IGBTs) and diodes.

When commercial AC power supply 21 is normal, controller 15 controls converter 1 such that DC voltage VD on DC line 2 becomes equal to a reference DC voltage VDR. When supply of AC power from commercial AC power supply 21 is stopped (when a power failure of commercial AC power supply 21 occurs), controller 15 stops operation of converter 1.

Bidirectional chopper 4 is controlled by controller 15, and provides and receives DC power between DC line 2 and battery 22. Bidirectional chopper 4 is a well-known bidirectional chopper including a plurality of sets of IGBTs and diodes, and a reactor.

When commercial AC power supply 21 is normal, controller 15 controls bidirectional chopper 4 such that battery voltage VB becomes equal to a reference DC voltage VBR. When a power failure of commercial AC power supply 21 occurs, controller 15 controls bidirectional chopper 4 such that DC voltage VD on DC line 2 becomes equal to reference DC voltage VDR. Converter 1, bidirectional chopper 4, and battery 22 constitute an embodiment of "DC power supply" that supplies DC power to inverter 5.

Inverter 5 is controlled by controller 15, and converts DC power supplied from converter 1 and bidirectional chopper 4 through DC line 2 into AC power of a commercial frequency and supplies the AC power to load 23. Inverter 5 is a well-known inverter including a plurality of sets of IGBTs and diodes.

When inverter 5 operates normally, AC power is supplied from inverter 5 to load 23. When inverter 5 does not operate normally, operation of inverter 5 is stopped. A method for controlling inverter 5 will be described later in detail.

Switch 6, bypass circuit 8, and switch 7 are connected in series between input terminal T1 and an output node 5a of inverter 5. Switches 6 and 7 are controlled by controller 15. Switches 6 and 7 are turned on while the uninterruptible power supply apparatus is in use, to connect bypass circuit 8 between input terminal T1 and output node 5a of inverter 5.

Switches 6 and 7 are turned off during maintenance of bypass circuit 8, to electrically disconnect bypass circuit 8 from commercial AC power supply 21 and load 23. As a result, bypass circuit 8 can be repaired or replaced.

Bypass circuit 8 includes a fuse 9, an interruption unit 10, and a semiconductor switch 11, which are connected in series between one terminal of switch 6 and one terminal of switch 7. Fuse 9 is blown when overcurrent flows, to protect bypass circuit 8, load 23 and the like.

Interruption unit 10 is turned on by controller 15 while the uninterruptible power supply apparatus is in use. When a power failure of commercial AC power supply 21 occurs and AC input voltage VI drops below a lower limit voltage, interruption unit 10 is turned off, to prevent backflow of AC power generated by inverter 5 toward commercial AC power supply 21.

Semiconductor switch 11 includes a pair of thyristors 12 and 13 connected in antiparallel, and is controlled by controller 15. When inverter 5 operates normally, semiconductor switch 11 is turned off. When inverter 5 does not operate normally, semiconductor switch 11 is turned on, so that AC power is supplied from commercial AC power supply 21 to load 23 through switch 6, bypass circuit 8, and switch 7.

Operation unit 14 includes a plurality of buttons, a plurality of switches, and an image display unit. By operating operation unit 14, a user of the uninterruptible power supply apparatus can automatically operate the uninterruptible power supply apparatus, or can select and perform a desired power feeding mode. Operation unit 14 outputs a signal and information indicative of what has been operated by the user to controller 15.

Based on the signal from operation unit 14, AC input voltage VI, AC output voltage VO, DC voltage VD, battery voltage VB, AC input current Ii, and an AC output current IO, controller 15 controls converter 1, bidirectional chopper 4, inverter 5, bypass circuit 8, and switches 6 and 7.

Figure 2:
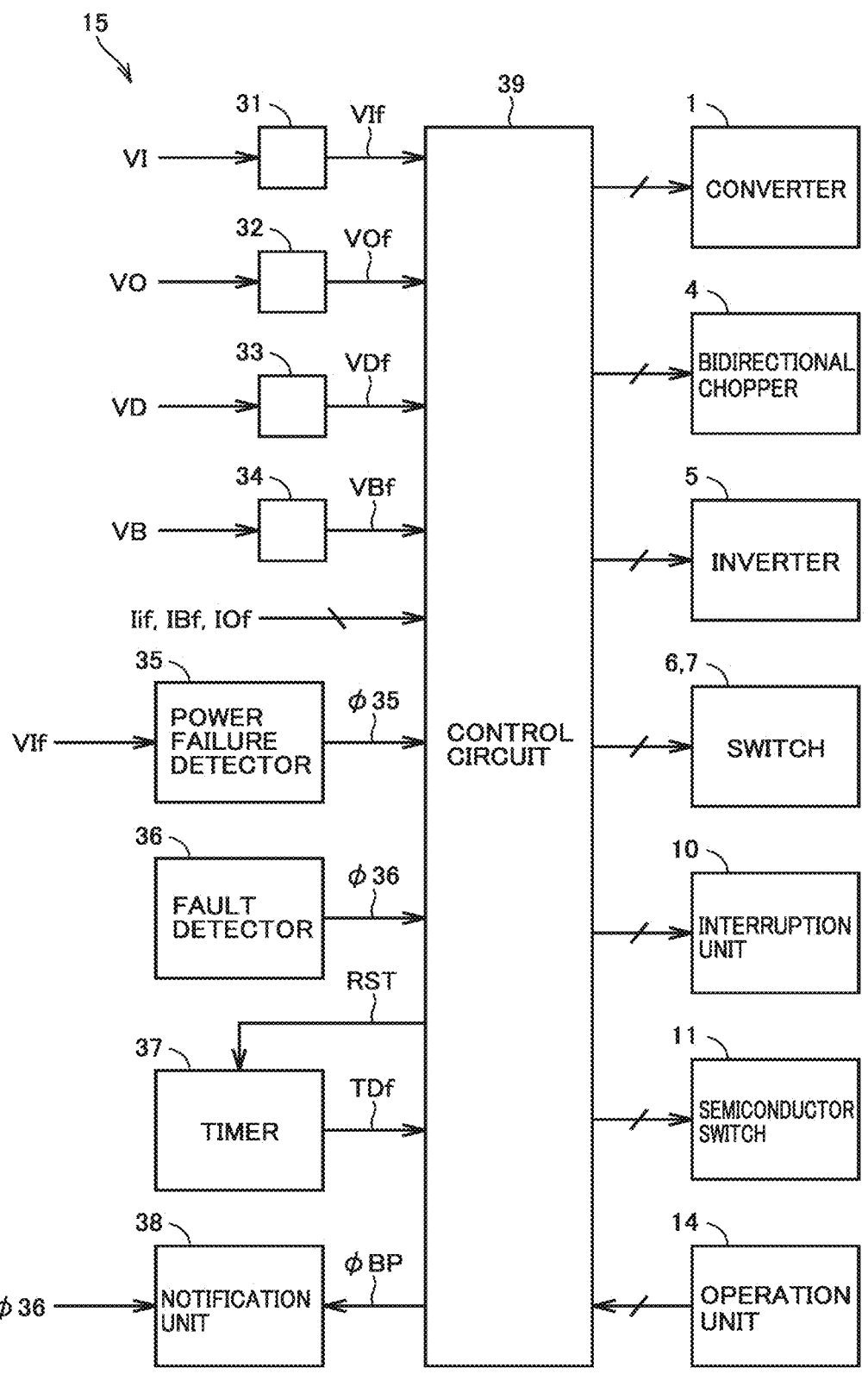
FIG. 2 is a block diagram showing a main part of a controller shown in FIG. 1.

FIG. 2 is a block diagram showing a main part of controller 15. In FIG. 2, controller 15 includes voltage detectors 31 to 34, a power failure detector 35, a fault detector 36, a timer 37, a notification unit 38, and a control circuit 39.

Voltage detector 31 detects an instantaneous value of AC input voltage VI supplied from commercial AC power supply 21, and outputs a signal VIf indicative of the detected value to power failure detector 35 and control circuit 39. Voltage detector 32 detects an instantaneous value of AC output voltage VO applied to load 23, and outputs a signal VOf indicative of the detected value to control circuit 39.

Voltage detector 33 detects an instantaneous value of DC voltage VD on DC line 2, and outputs a signal VDf indicative of the detected value to control circuit 39. Voltage detector 34 detects an instantaneous value of terminal-to-terminal voltage VB of battery 22, and outputs a signal VBf indicative of the detected value to control circuit 39. Output signals Iif, IBf and ILf from current detectors CD1 to CD3 (FIG. 1) are provided to control circuit 39.

Power failure detector 35 detects whether or not a power failure of commercial AC power supply 21 has occurred based on output signal VIf from voltage detector 31, and outputs a power failure detection signal φ35 indicative of the detection result to control circuit 39. When commercial AC power supply 21 is normal, power failure detection signal φ35 is set to an "L" level, which is a deactivation level. When a power failure of commercial AC power supply 21 has occurred, power failure detection signal φ35 is set to an "H" level, which is an activation level.

For example, when AC input voltage VI is higher than a lower limit value, power failure detector 35 determines that commercial AC power supply 21 is normal, and sets power failure detection signal φ35 to the "H" level, which is a deactivation level. When AC input voltage VI is lower than the lower limit value, power failure detector 35 determines that a power failure of commercial AC power supply 21 has occurred, and sets power failure detection signal φ35 to the "L" level, which is an activation level.

Fault detector 36 determines whether or not inverter 5 operates normally, and outputs a fault detection signal φ36 indicative of the determination result to control circuit 39. When inverter 5 operates normally, fault detection signal φ36 is set to the "L" level, which is a deactivation level.

When inverter 5 does not operate normally, fault detection signal φ36 is set to the "H" level, which is an activation level.

For example, fault detector 36 compares a waveform of a control signal that controls inverter 5 with a waveform of AC output voltage VO from inverter 5 or of load current IL, and determines whether or not inverter 5 operates normally based on the comparison result.

Timer 37 is reset when a reset signal RST from control circuit 39 is set to the "H" level, which is an activation level, for a prescribed time, measures a time TD that has elapsed since the reset, and outputs a signal TDf indicative of measured time TD to control circuit 39.

When fault detection signal φ36 is set to the "H" level, which is an activation level, notification unit 38 notifies the user of the uninterruptible power supply apparatus that a fault has occurred in inverter 5 by means of sound, light, image and the like. When a fault detection signal φBP from control circuit 39 is set to the "H" level, which is an activation level, notification unit 38 notifies the user of the uninterruptible power supply apparatus that a fault has occurred in bypass circuit 8 by means of sound, light, image and the like. Fault detection signal φBP will be described later.

Based on output signals VIf, VOf, VDf and VBf from voltage detectors 31 to 34, output signals IIf, IBf and IOf from current detectors CD1 to CD3, power failure detection signal φ35, fault detection signals φ36 and φBP, output signal TDf from timer 37, and the signal from operation unit 14, control circuit 39 controls the uninterruptible power supply apparatus as a whole.

That is, when commercial AC power supply 21 is normal and inverter 5 operates normally (φ35=L and φ36=L), control circuit 39 performs an inverter power feeding mode (first power feeding mode). At this time, control circuit 39 turns off semiconductor switch 11 to bring bypass circuit 8 out of conduction, and controls inverter 5 such that AC output voltage VO becomes equal to a prescribed value. In this case, AC power is supplied from inverter 5 to load 23.

When commercial AC power supply 21 is normal and inverter 5 does not operate normally (φ35=L and φ36=H), control circuit 39 performs a bypass power feeding mode (second power feeding mode). At this time, control circuit 39 turns on semiconductor switch 11 to bring bypass circuit 8 into conduction, and stops operation of inverter 5. In this case, AC power is supplied from commercial AC power supply 21 to load 23 through switch 6, bypass circuit 8, and switch 7. Therefore, even when a fault occurs in inverter 5, operation of load 23 can be continued.

When time TD indicated by output signal TDf from timer 37 exceeds a prescribed time Tc while the inverter power feeding mode is being performed, control circuit 39 performs a test mode (third power feeding mode). At this time, control circuit 39 turns on semiconductor switch 11 to bring bypass circuit 8 into conduction, and controls inverter 5 such that AC output current IO from inverter 5 becomes equal to a prescribed value. In this case, a current IBP flowing through bypass circuit 8 and output current IO from inverter 5 are summed to form load current IL=IBP+IO.

Control circuit 39 then decreases output current IO from inverter 5 while keeping AC power PL supplied to load 23 constant. When bypass circuit 8 operates normally and is conducting, decrease in output current IO from inverter 5 results in increase in current IBP flowing through bypass circuit 8, and no change in load current IL and AC output voltage VO, leading to VO=VI. In this case, control circuit 39 sets fault detection signal φBP to the "L" level, which is a deactivation level.

When bypass circuit 8 does not operate normally and is not conducting, current IBP flowing through bypass circuit 8 is 0 A, and decrease in output current IO from inverter 5 results in decrease in load current IL, and increase in AC output voltage VO from inverter 5 in order to keep AC power PL supplied to load 23 at a constant value.

When AC output voltage VO increases to a prescribed voltage VOH or more, control circuit 39 determines that bypass circuit 8 does not operate normally, and sets fault detection signal φBP to the "H" level, which is an activation level. Bypass circuit 8 does not operate normally when fuse 9 is blown, when interruption unit 10 is in the OFF state, or when semiconductor switch 11 is broken, for example.

When the test mode is completed, control circuit 39 sets reset signal RST to the "H" level, which is an activation level, for a prescribed time, resets timer 37, and performs the inverter power feeding mode again.

When a power failure of commercial AC power supply 21 occurs while the inverter power feeding mode is being performed, control circuit 39 performs a battery power feeding mode (fourth power feeding mode). At this time, control circuit 39 stops operation of converter 1, and controls bidirectional chopper 4 such that DC voltage VD on DC line 2 becomes equal to reference DC voltage VDR.

In this case, DC power of battery 22 is supplied to inverter 5 through bidirectional chopper 4 and converted into AC power, and the AC power is supplied to load 23. Therefore, even when a power failure of commercial AC power supply 21 occurs, operation of load 23 can be continued during the period in which battery 22 stores DC power.

Figure 3:
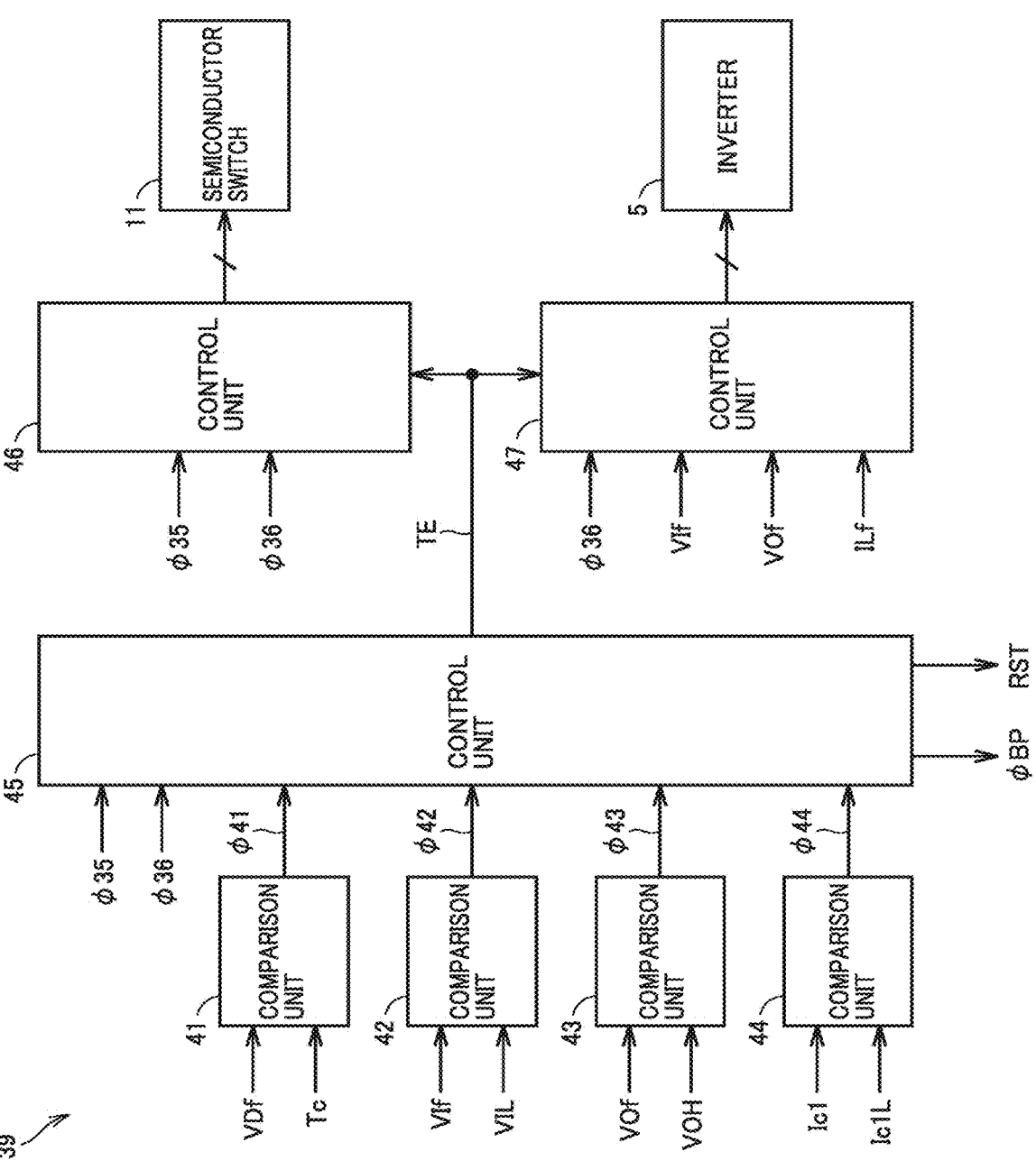
FIG. 3 is a block diagram showing a configuration of a portion associated with control of a semiconductor switch and an inverter in a control circuit shown in FIG. 2.

FIG. 3 is a block diagram showing a portion associated with control of semiconductor switch 11 and inverter 5 in control circuit 39. In FIG. 3, control circuit 39 includes comparison units 41 to 44 and control units 45 to 47.

Comparison unit 41 compares the length of time TD indicated by output signal TDf from timer 37 (FIG. 2) with the length of prescribed time Tc, and outputs a signal φ41 indicative of the comparison result to control unit 45. When TD<Tc holds, signal φ41 is set to the "L" level. When TD≥Tc holds, signal φ41 is set to the "H" level. Prescribed time Tc is a cycle in which the test mode is performed while the inverter power feeding mode is being performed.

Comparison unit 42 compares the level of AC input voltage VI indicated by output signal VIf from voltage detector 31 (FIG. 2) with the level of a lower limit voltage VIL, and outputs a signal φ42 indicative of the comparison result to control unit 45. When VI≥VIL holds, signal φ42 is set to the "H" level. When VI<VIL holds, signal φ42 is set to the "L" level.

Lower limit voltage VIL is the minimum required voltage for normal operation of load 23. When bypass circuit 8 is brought into conduction, VO=VI holds. When signal φ42 is at the "L" level (VI<VIL), therefore, bypass circuit 8 is prevented from being brought into conduction.

Comparison unit 43 compares the level of AC output voltage VO indicated by output signal VOf from voltage detector 32 (FIG. 2) with the level of prescribed voltage VOH, and outputs a signal φ43 indicative of the comparison result to control unit 45. When VO<VOH holds, signal φ43 is set to the "L" level. When VO≥VOH holds, signal φ43 is set to the "H" level. When AC output voltage VO increases and signal φ43 is set to the "H" level in the test mode, it is determined that bypass circuit 8 does not operate normally.

Comparison unit 44 compares the magnitude of a current command value Ic1 generated at control unit 47 in the test mode with the magnitude of a lower limit value Ic1L, and outputs a signal φ44 indicative of the comparison result to control unit 45. When Ic1>Ic1L holds, signal φ44 is set to the "H" level. When Ic1≤Ic1L holds, signal φ44 is set to the "L" level. When signal φ44 is set to the "L" level, operation of decreasing output current IO from inverter 5 is stopped.

Based on power failure detection signal φ35 (FIG. 2), fault detection signal φ36 (FIG. 2), and output signals φ41 to φ44 from comparison units 41 to 44, control unit 45 generates a test signal TE, fault detection signal φBP, and reset signal RST.

That is, when commercial AC power supply 21 is normal (φ35=L), inverter 5 operates normally (φ36=L), time TD measured by timer 37 is equal to or more than prescribed time Tc (φ41=H), and AC input voltage VI is higher than lower limit voltage VIL (φ42=H), control unit 45 sets test signal TE to the "H" level, which is an activation level, to start performing the test mode. Test signal TE is provided to control units 46 and 47.

When AC output voltage VO increases to prescribed voltage VOH or more (φ43=H) in the test mode, control unit 45 determines that bypass circuit 8 does not operate normally, sets fault detection signal φBP to the "H" level, which is an activation level, sets test signal TE to the "L" level, and sets reset signal RST to the "H" level for a prescribed time to reset timer 37.

When AC output voltage VO is lower than prescribed voltage VOH (φ43=L) in the test mode, control unit 45 determines that bypass circuit 8 operates normally, and sets fault detection signal φBP to the "L" level, which is a deactivation level, and when current command value Ic1 becomes equal to or less than lower limit value Ic1L (φ44=L), control unit 45 sets test signal TE to the "L" level, and sets reset signal RST to the "H" level for a prescribed time to reset timer 37.

Control unit 46 controls semiconductor switch 11 in accordance with power failure detection signal φ35 (FIG. 2), fault detection signal φ36 (FIG. 2), and test signal TE. When commercial AC power supply 21 is normal (φ35=L), inverter 5 operates normally (φ36=L), and test signal TE is at the "L" level, control unit 46 turns off semiconductor switch 11.

When commercial AC power supply 21 is normal (φ35=L), inverter 5 operates normally (φ36=L), and test signal TE is at the "H" level, control unit 46 turns on semiconductor switch 11.

When a fault occurs in inverter 5 while commercial AC power supply 21 is normal (φ35=L and φ36=H), control unit 46 turns on semiconductor switch 11. When a power failure of commercial AC power supply 21 occurs (φ35=H), control unit 46 turns off semiconductor switch 11.

Control unit 47 controls inverter 5 in accordance with test signal TE, fault detection signal φ36 (FIG. 2), output signal VIf from voltage detector 31 (FIG. 2), output signal VOf from voltage detector 32 (FIG. 2), and output signal ILf from current detector CD3 (FIG. 1). Control unit 47 operates in synchronization with AC input voltage VI indicated by signal VIf.

When inverter 5 operates normally (φ36=L) and test signal TE is at the "L" level, control unit 47 controls inverter 5 such that AC output voltage VO indicated by signal VOf becomes equal to a voltage command value Vc.

When inverter 5 operates normally (φ36=L) and test signal TE is at the "H" level, control unit 47 decreases current command value Ic1 while controlling inverter 5 such that AC output current ILf indicated by signal ILf becomes equal to current command value Ic1, and power PL determined from signals VOf and ILf becomes equal to a power command value Pc. When inverter 5 does not operate normally (φ36=H), control unit 47 stops operation of inverter 5.

Figure 4:
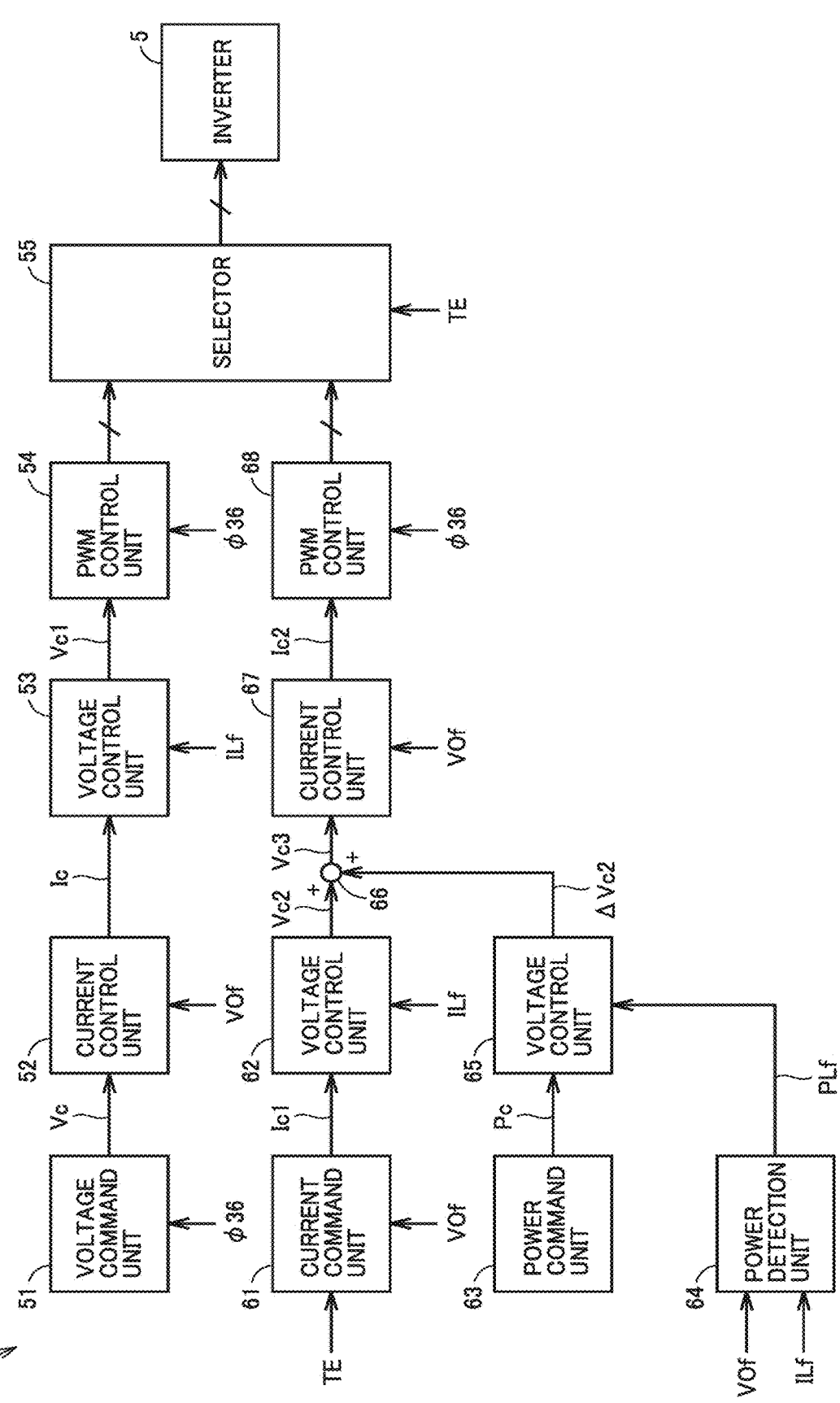
FIG. 4 is a block diagram showing a configuration of a control unit 47 shown in FIG. 3.

FIG. 4 is a block diagram showing a configuration of control unit 47. In FIG. 4, control unit 47 includes a voltage command unit 51, current control units 52 and 67, voltage control units 53, 62 and 65, a pulse width modulation (PWM) control units 54 and 68, a selector 55, a current command unit 61, a power command unit 63, a power detection unit 64, and an adder 66.

Voltage command unit 51 outputs prescribed voltage command value Vc. Voltage command value Vc is a sinusoidal signal of the same frequency and same phase as AC input voltage VI when commercial AC power supply 21 is normal. Current control unit 52 determines a difference ΔV=Vc−VO between voltage command value Vc and AC output voltage VO indicated by output signal VOf from voltage detector 32 (FIG. 2), and generates a current control value Ic to eliminate this difference ΔV.

Voltage control unit 53 determines a difference ΔI=Ic−IL between current control value Ic from current control unit 52 and load current IL indicated by output signal ILf from current detector CD3, and generates a voltage control value Vc1 to eliminate this difference ΔI.

When test signal TE is at the "L" level, which is a deactivation level, selector 55 couples PWM control unit 54 to inverter 5, and when test signal TE is at the "H" level, which is an activation level, selector 55 couples PWM control unit 68 to inverter 5.

When test signal TE is at the "L" level, PWM control unit 54 is coupled to inverter 5 by selector 55. When fault detection signal φ36 is at the "L" level, which is a deactivation level, PWM control unit 54 generates a PWM signal in accordance with voltage control value Vc1, and controls inverter 5 by this PWM signal. When fault detection signal φ36 is at the "H" level, which is an activation level, PWM control unit 54 stops operation of inverter 5.

Current command unit 61 generates prescribed current command value Ic1. Current command value Ic1 is a sinusoidal signal of the same frequency and same phase as load current IL. Current command unit 61 gradually decreases current command value Ic1 in response to test signal TE being set to the "H" level, which is an activation level.

Figure 5:
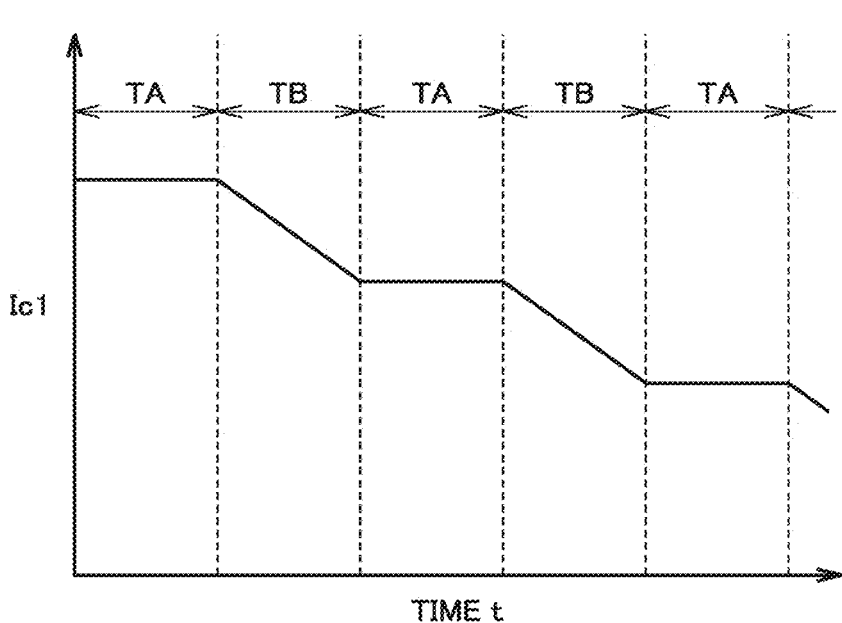
FIG. 5 is a time chart illustrating operation of a current command unit shown in FIG. 4.

FIG. 5 is a time chart illustrating operation of current command unit 61. In FIG. 5, current command unit 61 gradually decreases current command value Ic1 by alternately repeating a standby operation (period TA) of keeping current command value Ic1 constant, and a control operation (period TB) of decreasing current command value Ic1 at a prescribed rate. Current command unit 61 may decrease current command value Ic1 at a constant rate.

Voltage control unit 62 determines a difference ΔI=Ic1−IL between current command value Ic1 from current command unit 61 and load current IL indicated by output signal ILf from current detector CD3, and generates a voltage control value Vc2 to eliminate this difference ΔI.

Power command unit 63 outputs prescribed power command value Pc. Power detection unit 64 detects AC power PL=VO×IL supplied to load 23 based on AC output voltage VO indicated by output signal VOf from voltage detector 32 (FIG. 2) and load current IL indicated by output signal ILf from current detector CD3 (FIG. 1), and outputs a signal PLf indicative of the detected value.

Voltage control unit 65 generates a voltage control value ΔVc2 to eliminate a difference ΔP=Pc−PL between power command value Pc and AC power PL indicated by output signal PLf from power detection unit 64. Adder 66 adds voltage control value Vc2 generated by voltage control unit 62 and voltage control value ΔVc2 generated by voltage control unit 65, to generate a voltage control value Vc3=Vc2+ΔVc2.

Current control unit 67 determines a difference ΔV=Vc3−VO between voltage control value Vc3 generated by adder 66 and AC output voltage VO indicated by output signal VOf from voltage detector 32 (FIG. 2), and generates current control value Ic to eliminate this difference ΔV.

When test signal TE is at the "H" level, PWM control unit 68 is coupled to inverter 5 by selector 55. When fault detection signal φ36 is at the "L" level, which is a deactivation level, PWM control unit 68 generates a PWM signal in accordance with current command value Ic, and controls inverter 5 by this PWM signal. When fault detection signal φ36 is at the "H" level, which is an activation level, PWM control unit 68 stops operation of inverter 5.

Figure 6:
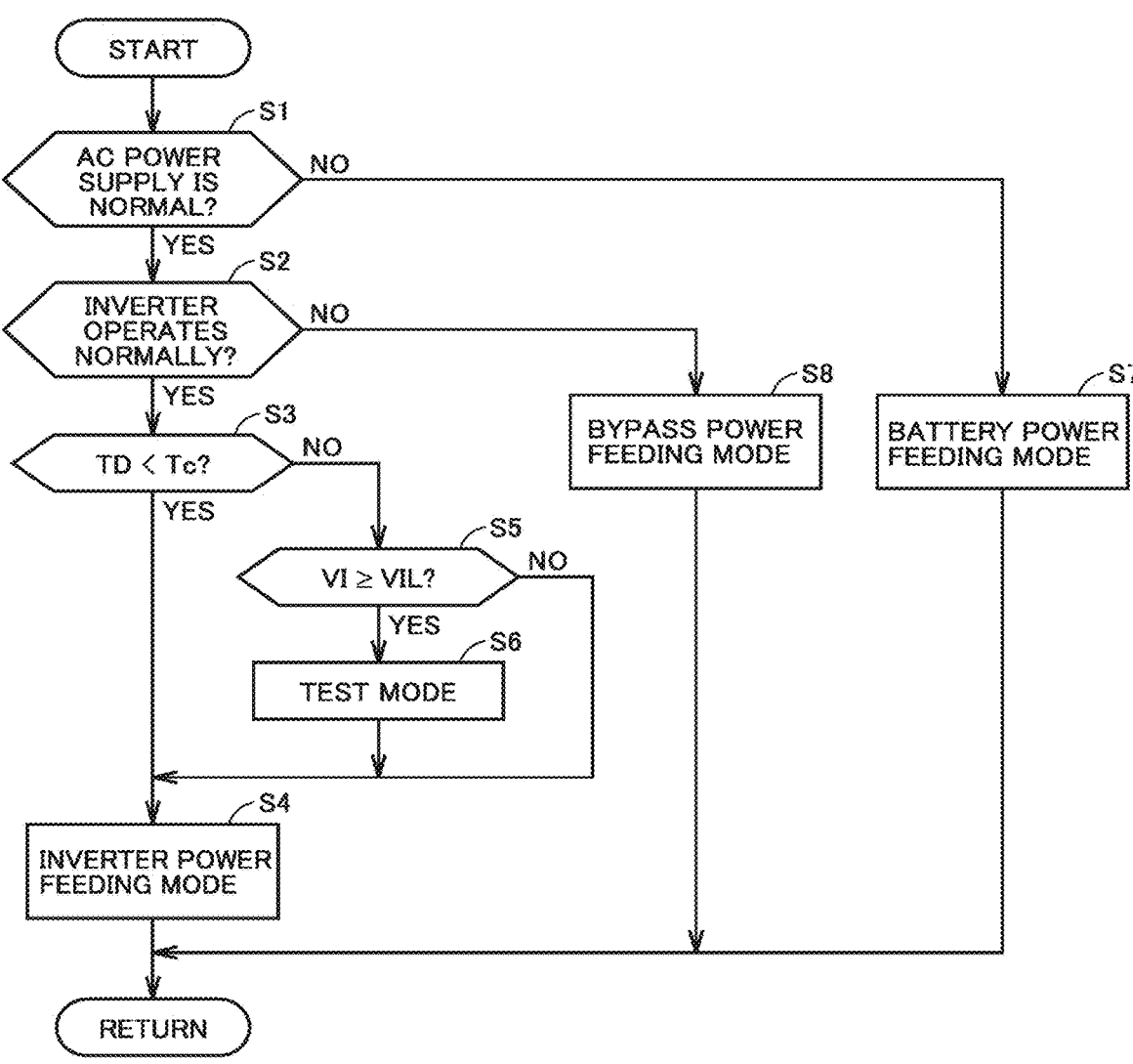
FIG. 6 is a flowchart illustrating operation of the control circuit shown in FIGS. 2 to 5.

FIG. 6 is a flowchart illustrating operation of control circuit 39 shown in FIGS. 2 to 5. In step S1 of FIG. 6, control circuit 39 determines whether or not commercial AC power supply 21 is normal based on power failure detection signal φ35. When commercial AC power supply 21 is normal (φ35=L), in step S2, control circuit 39 determines whether or not inverter 5 operates normally based on fault detection signal φ36.

When inverter 5 operates normally (φ36=L), in step S3, control circuit 39 determines whether or not time TD indicated by output signal TDf from timer 37 is shorter than prescribed time Tc.

When TD<Tc holds, in step S4, control circuit 39 performs the inverter power feeding mode, in which semiconductor switch 11 is turned off, and AC power generated by inverter 5 is supplied to load 23.

That is, when TD<Tc holds, output signal φ41 from comparison unit 41 (FIG. 3) is set to the "L" level, and test signal TE is set to the "L" level, which is a deactivation level, by control unit 45. When test signal TE is set to the "L" level, semiconductor switch 11 is turned off by control unit 46, and PWM control unit 54 (FIG. 4) is coupled to inverter 5 by selector 55.

Voltage command unit 51 outputs voltage command value Vc, current control unit 52 generates current control value Ic to eliminate the difference between this voltage command value Vc and AC output voltage VO, and voltage control unit 53 generates voltage control value Vc1 to eliminate the difference between this current control value Ic and load current IL. PWM control unit 54 controls inverter 5 in accordance with voltage control value Vc1. As a result, AC output voltage VO is maintained at a prescribed voltage.

Control circuit 39 repeatedly performs steps S1 to S4 while performing the inverter power feeding mode. When it is determined that TD<Tc does not hold in step S3, in step S5, control circuit 39 determines whether or not AC input voltage VI is equal to or more than lower limit voltage VIL. When VI≥VIL does not hold, a return is made to step S4. When I≥VIL holds, control circuit 39 performs the test mode in step S6 and returns to step S4.

Figure 7:
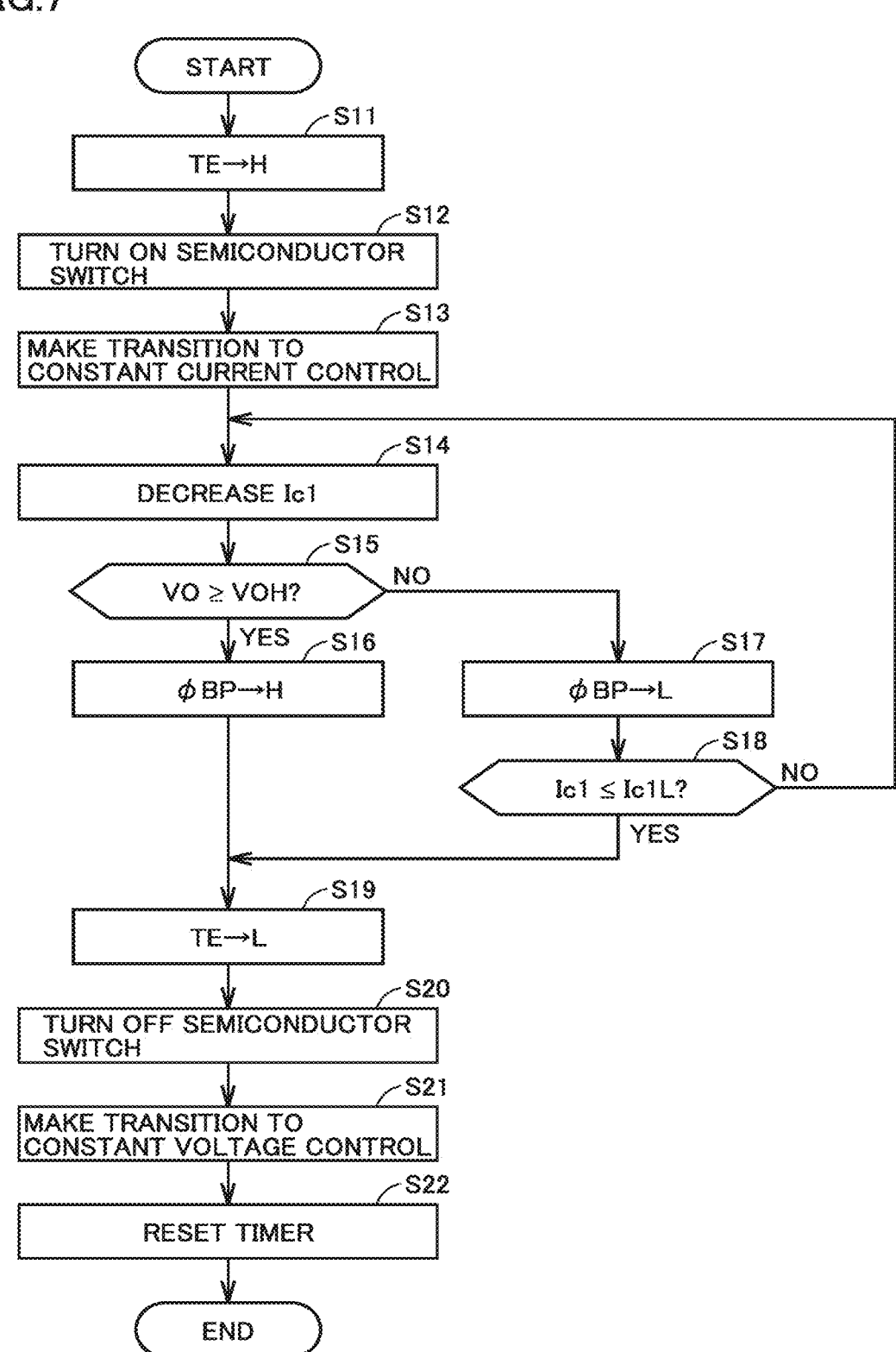
FIG. 7 is a flowchart illustrating operation in a test mode shown in FIG. 6.

FIG. 7 is a flowchart illustrating operation of control circuit 39 in the test mode. In step S11 of FIG. 7, control unit 45 (FIG. 3) in control circuit 39 sets test signal TE to the "H" level, which is an activation level.

When test signal TE is set to the "H" level, in step S12, control unit 46 (FIG. 3) turns on semiconductor switch 11.

In step S13, control unit 47 (FIG. 3) makes a transition from constant voltage control to constant current control.

That is, PWM control unit 68 and inverter 5 are coupled together by selector 55 (FIG. 4), and current command unit 61 outputs current command value Ic1. Voltage control unit 62 generates voltage control value Vc2 to eliminate the difference between this current command value Ic1 and load current IL.

In addition, power command unit 63 outputs power command value Pc, power detection unit 64 detects AC output power PL, and voltage control unit 65 generates voltage control value ΔVc2 to eliminate the difference between power command value Pc and AC output power PL.

Adder 66 adds voltage control value Vc2 and voltage control value ΔVc2 to generate voltage control value Vc3, and current control value Ic2 is generated to eliminate the difference between this voltage control value Vc3 and AC output voltage VO. PWM control unit 68 controls inverter 5 in accordance with current control value Ic2. As a result, load current IL is maintained at a prescribed current value.

In step S14, current command unit 61 gradually decreases current command value Ic1 (FIG. 5) when test signal TE is set to the "H" level, which is an activation level. Decrease in current command value Ic1 results in decrease in output current IO from inverter 5 (FIG. 1).

When bypass circuit 8 (FIG. 1) operates normally and is conducting, current corresponding to the decrease in output current IO from inverter 5 flows from commercial AC power supply 21 to load 23 through switch 6, bypass circuit 8, and switch 7.

At this time, load current IL is the sum of output current IO from the inverter and current IBP flowing through bypass circuit 8 (IL=IO+IBP). In addition, AC input voltage VI is provided to load 23 through switch 6, bypass circuit 8, and switch 7, leading to VO=VI. Therefore, even when current command value Ic1 is decreased, AC power PL supplied to load 23 is maintained at power command value Pc, a power command value ΔVc1 is zero, and AC output voltage VO remains unchanged.

In contrast, when bypass circuit 8 does not operate normally and is not conducting, current corresponding to the decrease in output current IO from inverter 5 is not supplemented from the bypass circuit 8 side, resulting in output current IO from inverter 5 being load current IL (IL=IO). Therefore, AC power PL supplied to load 23 decreases, voltage command value ΔVc1 increases, and AC output voltage VO increases.

In step S15, control unit 45 (FIG. 3) determines whether or not AC output voltage VO is higher than threshold voltage VOH based on output signal φ43 from comparison unit 43. When VO≥VOH holds (φ43=H), control unit 45 determines that bypass circuit 8 does not operate normally and sets fault detection signal φBP to the "H" level, which is an activation level, and proceeds to step S19.

When fault detection signal φBP is set to the "H" level, notification unit 38 (FIG. 2) notifies the user of the uninterruptible power supply apparatus that a fault has occurred in bypass circuit 8. The user turns off switches 6 and 7 by operating operation unit 14 to electrically disconnect bypass circuit 8 from commercial AC power supply 21, inverter 5 and load 23, repairs or replaces bypass circuit 8 with a new one, and turns on switches 6 and 7 by operating operation unit 14. Therefore, bypass circuit 8 is not brought into conduction when a fault occurs in inverter 5, to prevent operation of load 23 from being stopped.

When VO<VOH holds (φ43=L) in step S15, in step S17, control unit 45 determines that bypass circuit 8 operates normally and sets fault detection signal φBP to the "L" level, which is a deactivation level, and proceeds to step S18.

In step S18, control unit 45 determines whether or not current command value Ic1 is smaller than lower limit value Ic1L based on output signal φ44 from comparison unit 44. When Ic1>Ic1L holds (φ44=H), control unit 45 determines that current command value Ic1 has not yet been sufficiently decreased and returns to step S14. When Ic1≤Ic1L holds (φ44=L), control unit 45 determines that current command value Ic1 has been sufficiently decreased and proceeds to step S19.

In step S19, control unit 45 sets test signal TE to the "L" level, which is a deactivation level. In step S20, control unit 46 (FIG. 3) turns off semiconductor switch 11.

In step S21, control unit 47 (FIG. 3) makes a transition from constant current control to constant voltage control. In the constant voltage control, PWM control unit 54 (FIG. 4) is coupled to inverter 5 by selector 55, and inverter 5 is controlled such that AC output voltage VO becomes equal to voltage command value Vc.

In step S22, control unit 45 (FIG. 3) sets a reset signal φRST to the "H" level for a prescribed time to reset timer 37 (FIG. 2). Timer 37 thus reset resumes measuring time TD from 0 second. The test mode is thus completed, and a return is made to step S4.

Referring again to FIG. 6, control circuit 39 resumes the inverter power feeding mode, and repeatedly performs steps S1 to S4 while performing the inverter power feeding mode. When it is determined that commercial AC power supply 21 is not normal (φ35=H) in step S1, control circuit 39 (FIG. 2) performs the battery power feeding mode in step S7, in which operation of converter 1 (FIG. 1) is stopped, and bidirectional chopper 4 is controlled such that DC voltage VD on DC line 2 becomes equal to reference DC voltage VDR.

Inverter 5 converts AC power supplied from battery 22 through bidirectional chopper 4 and DC line 2 into DC power, and supplies the DC power to load 23. Therefore, even when a power failure of commercial AC power supply 21 occurs, operation of load 23 can be continued during the period in which battery 22 stores DC power.

When inverter 5 does not operate normally (φ36=H) in step S2, control circuit 39 performs the bypass power feeding mode in step S7. That is, control unit 46 (FIG. 3) turns on semiconductor switch 11, control unit 47 stops operation of inverter 5, and AC power continues to be supplied from commercial AC power supply 21 to load 23 through switch 6, bypass circuit 8, and switch 7. Therefore, even when a fault occurs in inverter 5, operation of load 23 can be continued.

As described above, according to the uninterruptible power supply apparatus of the present embodiment, while the inverter power feeding mode is being performed, the test mode is performed in which bypass circuit 8 is brought into conduction, and it is determined whether or not bypass circuit 8 operates normally based on output voltage VO from inverter 5. Therefore, when it is determined that bypass circuit 8 does not operate normally, bypass circuit 8 can be repaired or replaced with a new one, to prevent operation of load 23 from being stopped when a fault occurs in inverter 5.

It should be understood that the embodiment disclosed herein is illustrative and non-restrictive in every respect. The present disclosure is defined by the terms of the claims, rather than the description above, and is intended to include any modifications within the scope and meaning equivalent to the terms of the claims.

REFERENCE SIGNS LIST

T1 input terminal; T2 battery terminal; T3 output terminal; CD1 to CD3 current detector; 1 converter; 2 DC line; 3 capacitor; 4 bidirectional chopper; 5 inverter; 6, 7 switch; 8 bypass circuit; 9 fuse; 10 interruption unit; 11 semiconductor switch; 12, 13 thyristor; 14 operation unit; 15 controller; 21 commercial AC power supply; 22 battery; 23 load; 31 to 34 voltage detector; 35 power failure detector; 36 fault detector; 37 timer; 38 notification unit; 39 control circuit; 41 to 44 comparison unit; 45 to 47 control unit; 51 voltage command unit; 52, 67 current control unit; 53, 62, 65 voltage control unit; 54, 68 PWM control unit; 55 selector; 61 current command unit; 63 power command unit; 64 power detection unit; 66 adder.

The invention claimed is:

1. A power supply apparatus comprising:
an inverter that converts DC power supplied from a DC power supply into AC power;
a bypass circuit connected between an AC power supply and a load and connected parallel to the inverter and the DC power supply; and
a controller that controls the inverter and the bypass circuit, wherein
when the inverter operates normally, the controller performs a first power feeding mode of bringing the bypass circuit out of conduction, and supplying AC power from the inverter to the load,
when the inverter does not operate normally, the controller performs a second power feeding mode of bringing the bypass circuit into conduction, and stopping operation of the inverter, and
while the first power feeding mode is being performed, the controller performs a third power feeding mode of bringing the bypass circuit into conduction, and determining whether or not the bypass circuit operates normally based on output voltage from the inverter, wherein
in the third power feeding mode,
the controller brings the bypass circuit into conduction, and decreases output current from the inverter while keeping AC power supplied to the load constant, and
the controller determines that the bypass circuit does not operate normally when output voltage from the inverter increases.

2. The power supply apparatus according to claim 1, wherein
in the first power feeding mode, the controller controls the inverter such that output voltage from the inverter becomes equal to a voltage command value, and
in the third power feeding mode, the controller controls the inverter such that output current from the inverter becomes equal to a current command value, and decreases output current from the inverter by decreasing the current command value.

3. The power supply apparatus according to claim 1, wherein
the controller performs the third power feeding mode in a predetermined cycle while the first power feeding mode is being performed.

4. The power supply apparatus according to claim 1, wherein
when the controller determines that the bypass circuit does not operate normally, the controller notifies a user of the power supply apparatus as such.

5. The power supply apparatus according to claim 1, wherein the DC power supply includes a rectifier that converts AC power supplied from the AC power supply into DC power, and a power storage device that stores DC power, when the AC power supply is normal, DC power generated by the rectifier is supplied to the inverter and stored in the power storage device, and when a power failure of the AC power supply occurs while the first power feeding mode is being performed, the controller performs a fourth power feeding mode of stopping operation of the rectifier, supplying DC power of the power storage device to the inverter, and supplying AC power from the inverter to the load.

\* \* \* \* \*